United States Patent [19]

Miano et al.

[11] Patent Number: 5,291,331
[45] Date of Patent: Mar. 1, 1994

[54] LIGHT CONFINING CAVITY WITH ANGULAR-SPATIAL LIMITATION OF THE ESCAPING BEAM

[76] Inventors: Juan C. Miano, c/ Juan Vigéon 9,7, 28003 Madrid, Spain; Antonio Luque, c/ Alejandro Rodriquez, 19, 1-C, 28039 Madrid, Spain

[21] Appl. No.: 733,147

[22] Filed: Jul. 19, 1991

[30] Foreign Application Priority Data

Jul. 23, 1990 [ES] Spain .................................. 9001985

[51] Int. Cl.$^5$ .............................................. G02B 17/00
[52] U.S. Cl. .................................... 359/598; 359/592; 359/853
[58] Field of Search ............... 359/591, 592, 595, 597, 359/598, 868, 850, 851, 853; 136/253, 259

[56] References Cited

U.S. PATENT DOCUMENTS 4,960,468 10/1990 Sinton et al. ........................ 136/259

Primary Examiner—Bruce Y. Arnold
Assistant Examiner—Darryl Collins
Attorney, Agent, or Firm—Dickinson, Wright, Moon, Van Dusen & Freeman

[57] ABSTRACT

A light confining cavity collects much of the radiation reflected by a receiver, absorbing it imperfectly, and casts it again on the same receiver or on other receivers by means of an optical system. Only light in a bundle of rays of limited angular spread can escape from this cavity, which allows an entry aperture relatively large. Thus, the irradiance at the entry aperture may be low, and in some cases even lower than the irradiance at the absorber. In this way the requirements for the cavity materials and for the concentrating system feeding light to the cavity can be relaxed. The invention is of special interest in photovoltaic conversion devices because it improves the absorption of the solar cells and achieves higher conversion efficiency for photons of different energies by using solar cells of different materials.

4 Claims, 3 Drawing Sheets

LIGHT CONFINING CAVITY WITH ANGULAR-SPATIAL LIMITATION OF THE ESCAPING BEAM

TECHNICAL FIELD

This invention relates to the confinement of electromagnetic energy, in particular luminous energy, in a cavity to allow for greater absorption. An important application is in the photovoltaic conversion of solar energy.

BACKGROUND OF THE INVENTION

The best known precedent of this invention is the integrating sphere, also called Helmholz sphere, which is widely used in optical apparatus. The integrating sphere consists of a spherical surface internally covered with an absorber and having a hole, or entry aperture, through which the radiation enters into the cavity. Radiation which has entered the cavity has many possibilities to be absorbed, even if the absorber is poor, because the probability that the light will escape from the cavity through the aperture is small.

A typical application of the integrating sphere is as a black absorber, often done by painting the internal wall of sphere black.

These spheres are also used for purposes other than to enhance light absorption. For instance, they can be internally painted white to produce homogeneous, isotropic illumination on a receiver.

If a certain radiant power is to be absorbed, it must enter entirely through the small entry aperture, which requires a highly concentrated radiant flux at the aperture. This poses many problems, such as expense and excessive heating of the materials used at the entry aperture.

The use of this type of cavity for photovoltaic applications has been proposed by Swanson (U.S. Pat. No. 4,234,352). In this patent the light from a concentrator is cast on a receiver located inside one of such integrating spheres. The receiver becomes hot and emits light with a spectrum cooler than that of the sun, which is better for efficient conversion by a solar cell. Furthermore, light not absorbed by the cell is re-injected into the cavity and again heats the absorber. Because the only optical losses are those in the solar cells, partly recovered as useful electric energy, the losses in the cavity walls and the light escaping through the cavity entry aperture must be kept as small as possible. This requires a high irradiance at the entry aperture from the external concentrator.

Another precedent is the device proposed by R. A. Sinton and R. M. Swanson (IEEE Electron Device Letters, ED-8, 11, pp 547-549, 1987 and in the U.S. Pat. No. 4,960,468) consisting of an internally mirrored box, one of the faces of which has an opening through which the light enters into the cavity and a solar cell located in front of it. The light reflected by the cell, due to reflection on the metal fingers located on top of it for effective current collection, or by the semiconductor itself, is reflected back almost totally and so increases the light collection. In some of the examples, the cavity is hemispheric and the solar cell covers the equator of the hemisphere. However, the only reduction in the loss of light that escapes through the opening is by decreasing the opening size.

We have proposed (A. Luque, J. C. Minano, G. L. Araûjo, G. Sala and A. Cuevas, in Proc. 9th EC Photovoltaic Solar Energy Conference, Kluwer Academic, Dordrecht, pp. 802, 1989) a device consisting of a classical integrating sphere covered internally by solar cells to enhance the absorption in the way mentioned above. In a second device proposed there, some of the cells covering the inner surface of the integrating sphere are of a certain type, for instance silicon, and the other cells are another type, for example GaAs. The cells are covered with filters such that photons not absorbed by GaAs are reflected by the GaAs cell and photons absorbed by GaAs are reflected by the Si cell. In this way an efficient spectrum splitting scheme is produced which can also be extended to cells of more bandgaps.

In all known prior cases, the opening of the cavity must be rather small. For example, in the device of U.S. Pat. No. 4,960,468 the opening must be less than 0.2 times the cell area, implying a high concentration at the entry aperture which is often achieved with a secondary attached to the cavity aperture.

SUMMARY OF THE INVENTION

The present invention relates to a cavity that prevents escape of most of the radiation reflected by a receiver that is not a perfect absorber. The confinement of the radiation reflected into the cavity is not based on reducing the size of the entry aperture, as it is in prior cavities, but instead, on reducing the angular spread of the escaping bundle.

Photons can enter or leave the cavity through the entry aperture. It cannot be avoided that some of the reflected photons will escape through the entry aperture, but this escape must be reduced as much as possible. While the small entry apertures of prior cavities results in a loss of concentration at the receiver with respect to that at the cavity aperture, the cavity of the invention achieves confinement of the radiation reflected by the receiver by restricting the angular spread of the escaping bundle. In this way the entry aperture may have a large area, and thus, the irradiance levels there are low. With the cavities of the invention, the requirements of design of the concentrating system feeding the cavity are relaxed as are the requirements of the materials used in the cavity fabrication.

These cavities may include several receivers of different characteristics. In particular, the receivers can be solar cells of different materials such that the spectrum of the solar radiation is shared among the receivers to optimize the solar-to-electricity conversion.

Characterization of the inventive cavities is facilitated by the notion of the "etendue" of a bundle of rays. The etendue of a bundle of rays is its volume in the phase-space (See W. T. Welford, R. Winston; High Collection Nonimaging Optics; Academic Press, N.Y., 1989). The etendue can be defined as P/B, where a given bundle of rays carries a power P and each ray of the bundle is illuminated with a constant brightness B, the brightness or radiance being measured as power per unit of surface area and per unit of stenodian. The etendue is constant along the bundle trajectory through a passive optical system.

For instance, let $E_4$ be the etendue of the bundle of rays $H_r$ leaving (or reaching) the receiver. That is, $H_r$ is the set of rays leaving the receiver at any point and at any direction. If the receiver is immersed in a medium with refractive index 1, then $E_r = \pi A_r$, where $A_r$ is the area of the receiver. Now, let $E_{er}$ be the etendue of the bundle of rays $H_{er}$ crossing the entry aperture and reaching the receiver. Obviously, $H_{er}$ is a subset of $H_r$ and so $E_{er} \leq E_r$. The set of rays belonging to $H_r$ and not belonging to $H_{er}$ is called $H_{rne}$, its etendue is $E_{rne}$ and $E_{rne} = E_r - E_{er}$. The degree of confinement can be measured with the variable $\Delta$, called the cavity etendue concentration, and $\Delta = E_{er}/E_r$. As $\Delta$ decreases, the degree of confinement increases.

In prior art cavities, any ray crossing the entry aperture reaches the receiver, and $H_{er}$ coincides with the bundle of rays $H_e$ crossing the aperture. In these cases, $E_{er} = \pi A_e = E_e$, where $A_e$ is the area of the entry aperture, and $E_e$ is the etendue of $H_e$. Then $\Delta = A_e/A_r$ i.e., $\Delta$ coincides with the cavity concentration D, which is defined as $D = A_e/A_r$. These cavities require small apertures to have small values of $\Delta$ and so to have a high degree of confinement. In the cavities of this invention, $H_{er}$ does not coincide with $H_e$, and since $E_{er} < E_e$ ($H_{er}$ is a subset of $H_e$) then $\Delta < D$, i.e., it is possible to have a high degree of confinement (small $\Delta$) while the area of the cavity aperture $A_e$ is large compared with $A_r$.

DESCRIPTION OF THE PREFERRED EMBODIMENTS

Let $H_{enr}$ be the rays of the set $H_e$ not belonging to $H_{er}$, that is the bundle of rays entering the aperture that does not reach the receiver. Its etendue is $E_{enr} = \pi A_e - E_{er}$. Similarly, we have called $H_{rne}$ the rays of $H_r$ not belonging to the bundle $H_{re}$ linking the receiver and the entry aperture. Its etendue is $E_{rne} = \pi A_r - E_{er}$. In this text, two bundles with their rays reversed, like $H_{er}$ and $H_{re}$ are considered the same bundle (indeed, they have the same etendue $E_{er} = E_{re}$).

An "ideal" cavity is one in which the power $P_e$ entering through the entry aperture is totally carried by the bundle $H_{er}$. If all of the internal components are also ideal, in the sense that they are perfect mirrors and non absorbing dielectrics, the only absorption is then produced at the receiver, which has an absorbance a. If the reflected brightness $B_r$ is isotropic (the receiver reflects diffusely) and homogeneous, the power incident on the receiver is $\pi B_r A_r/(1-a)$ (otherwise $\pi B_r A_r$ cannot be the reflected power) and therefore the power absorbed at the receiver is $a \pi B_r A_r/(1-a)$. The power escaping from the cavity is $B_r E_{re}$. A balance of power leads to $$P_e = B_r E_{re} + a\pi B_r A_r/(1-a).$$

From this equation, the absorbance of the cavity, defined as the ratio of the power absorbed to the power injected to the cavity, i.e., $a' = [a\pi B_r A_r/(1-a)]/P_e$ is calculated as $$a' = a[a + (1-a)\Delta]$$

where $\Delta = E_{re}/\pi A_r < 1$ is the cavity etendue concentration, already defined. This formula shows, that under the assumptions indicated above, a' increases and tends to one when $\Delta$ tends to zero. On the contrary, when $\Delta$ tends to one, meaning a very ineffective cavity, or no cavity at all, a' tends to a.

The structure of cavities with $\Delta < D$ described below is based on the two principles that (A) the cavity has an internal optical system that reflects the bundle $H_{rne}$ into itself and (B) the internal optical system reflects the bundle $H_{enr}$ into itself.

In the first case, the photons travelling by the rays of $H_{rne}$ are reflected into themselves by the optical system of the cavity and hit the receiver again to have a second chance of being absorbed. Once they reach the receiver, the photons can be reflected again by it. If they are reflected within the bundle $H_{rne}$, they will be again reflected back and so on. However a part of the radiation is reflected by the receiver in the bundle $H_{re}$ that links the receiver and the entry aperture, and only this radiation, can escape. However as this bundle has a limited angular spread at the entry aperture, since there is a non void bundle $H_{enr}$ (that jointly with $H_{er} = H_{re}$, forms the isotropic bundle $H_e$), then a cavity designed according to this principle has an angle-limited escaping beam.

Figure 3:
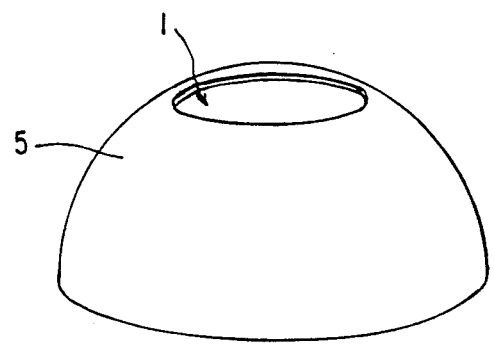
FIG. 3 represents a perspective view of the RDC in FIG. 2.
Figure 2:
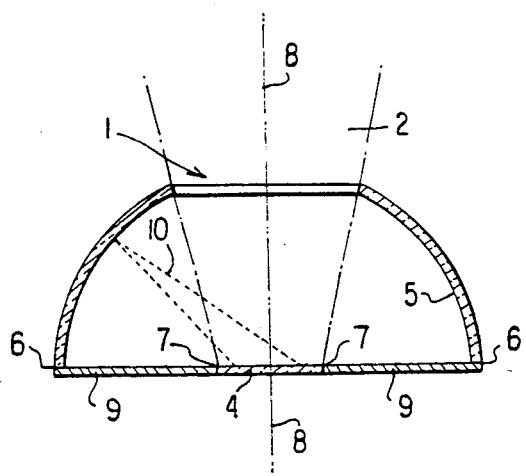
FIG. 2 represents the cross section of a radiating disc cavity (RDC) for a single absorber, comprehended by this invention.

The simplest way of achieving the first principle of design, is to use a curved mirror whose surface is perpendicular to the geometrical vector flux lines associated with the bundle $H_r$ of rays leaving the receiver. Any hole in the mirror so formed may be the entry aperture. Examples of this cavity are shown in FIGS. 2 and 3, which will be explained in detail below.

Figure 10:
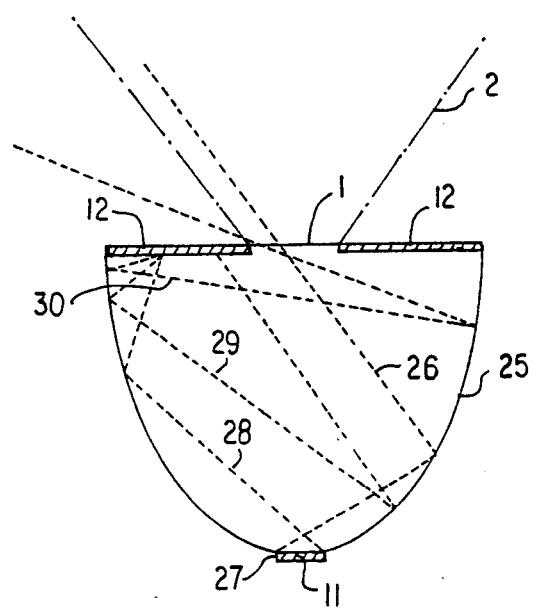
FIG. 10 represents a cavity formed by a Compound Parabolic Concentrator and a cover.

Cavities based on this principle can be formed if we consider the receiver not as an isolated element but coupled to a certain additional optical system (for example a concentrator) that modifies the geometrical vector flux escaping from it. The bundle $H_{re}$ will now link the receiver with the entry aperture after being deflected by the optical system, but nothing essential is changed of the preceding argumentation. An example of this concept is given in FIG. 10. In this figure, the receiver is coupled to a Compound Parabolic Concentrator (CPC). The lines of the geometrical vector flux of $H_r$ are now modified by the CPC. In particular, the lines are normal to the plane of the concentrator entry aperture, so the shape of the mirror of the cavity can be in this case coincident with the concentrator entry aperture. The cavity entry aperture is any hole on the mirror surface.

For the definition of the geometrical vector flux see, for instance: J. C. Minano, Chap 11 and 12 in A. Luque, Solar Cells and Optics in Photovoltaic Concentration, Adam Hilger, Bristol, 1989 or in I. M. Basset, W. T. Welford, and R. Winston, Nonimaging Optics Concentration, in E. Wolf Ed. Progress in Optics, vol XXVII North Holland, Amsterdam, 1989.

The second principle of design is based on reflecting the bundle $H_{enr}$ into itself (instead of $H_{rne}$ as in case (A)). If only the bundle $H_{er}$ is illuminated and carries radiation power from a external source, no power escapes in rays of $H_{rne}$, that are all dark. In consequence, the escaping power is angle-restricted to the bundle $H_{er}$, as in case (A). Note that in this case, unlike case (A), it must be assured that the cavity is physically closed by reflecting material, and rays can only escape through the entry aperture.

Figure 4:
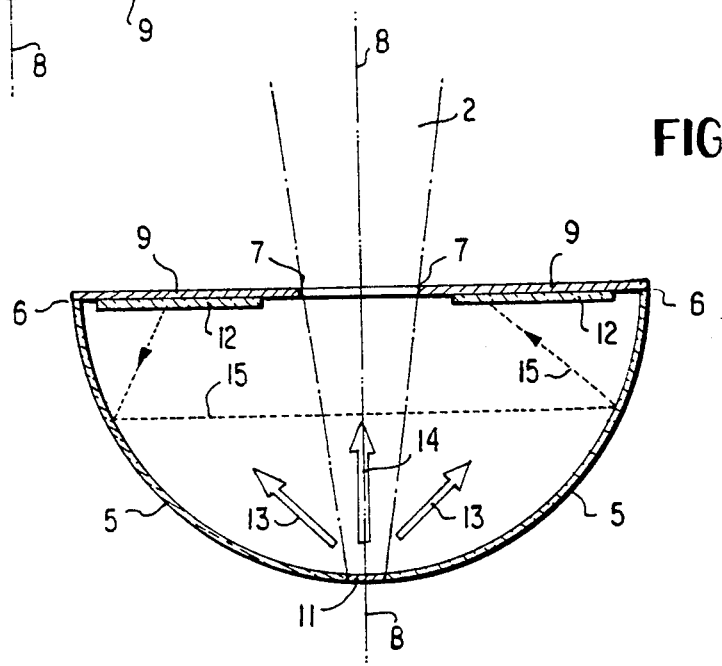
FIG. 4 represents a cross section of a RDC for a double absorber, also comprehended by this invention.
Figure 5:
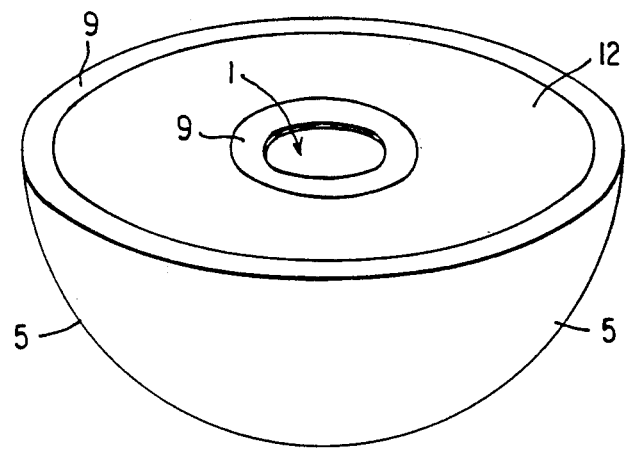
FIG. 5 represents a perspective view of the RDC in FIG. 4.

The simplest way of achieving this, is to use a curved mirror whose surface is perpendicular to the geometrical vector flux lines associated with the bundle $H_e$ of rays leaving the entry aperture. The receiver can be located at any position on this surface. Examples of this cavity are shown in FIGS. 4 or 5. Again in this case the entry aperture can be associated to an additional optical system, that modifies its geometrical vector flux lines. In this last case the cavity mirror should be normal to the lines of the geometrical vector flux corresponding to $H_3$ modified by the additional optical system.

This specific procedure (B) can be used for cavities with cells of several bandgaps. The higher bandgap cell is located as the receiver described before. It receives first all the radiation that goes through the entry aperture. The reflected bundle $H_r$ can behave now as the entering bundle of a new cavity. The lower bandgap cells are now recommended (but not forced) to be located where the geometrical vector flux of $H_e$ is zero. Reflecting walls must be used to close physically the cavity. In this way we guarantee that no light will escape directly from reflection on the low bandgap cell, but only after a second reflection on the high bandgap cell that is acting as entry aperture for this second cavity. In other words, the low bandgap cell reflections are confined by means of two cascaded cavities. This is illustrated in detail in FIGS. 4 and 5.

Neither design procedure (A) and (B) provides an optical system that reflects exactly the bundles $H_{rne}$ and $H_{enr}$ into themselves, with the exception of some particular and interesting cases, one of which is when the receiver or the cavity aperture are disks. In the general case, the mirror resulting from these design procedures reflects very accurately the bundle into itself.

DETAILED EXPLANATION OF THE FIGURES

Figure 1:
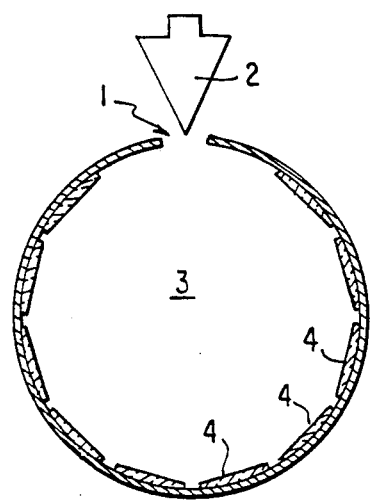
FIG. 1 represents a prior art integrating sphere.

To understand properly the novelty and the reach of the present invention it may help to explain with some detail some of the precedents. A light confining cavity of classical nature is represented in FIG. 1. A small entry aperture 1 allows the light 2 to enter into the cavity 3. In the best case, the light hits first the receivers 4 attached to the cavity wall. The light hitting the walls is partly reflected, diffusely or with mirror reflection, so that the light finally becomes almost isotropic inside the cavity.

It can be shown that if a sphere is illuminated by a circular hole in its surface, that radiates isotropically, and the walls are internally covered of an homogeneous material that reflects diffusely with reflectance $(1-a)$, then the walls are homogeneously illuminated and reflect a brightness $B_r$.

In addition the escaping bundle $H_{re} = H_e$, i.e. $H_{er}$ coincides with the isotropic bundle at the entry aperture. In consequence, for this cavity $\Delta = E_{er}/E_r = (\pi A_e)/(\pi A) = D$. The absorbance of the cavity $a'$ is $$a' = a/[a + (1-a)D]$$

and any increase of $a'/a$ is achieved by means of a small D, that implies $A_e < A_r$.

The cavity in FIG. 2 is based in the principle of construction (A) above. The curved mirror 5 is an ellipsoid of revolution formed by turning the ellipse having vertices 6 and foci 7 around the axis 8. A circular opening 1 on the top of the ellipsoid forms the entry aperture, through which a bundle of light 2 falls on receiver 4, which is circular and located on the bottom. Although not totally necessary, a bottom cover 9 can close the cavity.

A perspective view of the cavity of FIG. 2 is shown in FIG. 3, the back face of the mirror 5 being seen.

The surfaces perpendicular to the lines of the geometrical vector flux created by a disc, represented as segment 4 (the receiver), are ellipsoids of revolution like 5, whose meridians are ellipses having their foci in the extremes of the disc. If the ellipsoid is replaced by a mirror, then the rays in the bundle originating at the disc are reflected into a bundle ending on the same disc. This is the case of ray 10 that issues from the receiver 4 and is turned back into it again by the mirrored ellipsoid. By its principle of construction we call this cavity a radiating disc cavity (RDC).

The behavior of the cavity should now be clear. The rays reflected diffusively by the receiver are either directed to the entry aperture (belonging to bundle $H_{re}$), or to the mirror (belonging to $H_{rne}$), the latter being turned back toward the receiver.

In this case the condition of homogeneous brightness $B_r$ is almost fulfilled if receiver and aperture are well separated. The etendue of the bundle formed by the rays linking both discs, that is just the bundle $H_{re}$, is $E_{re} = \pi A_e A_r / A_t$, $A_e$ being the entry aperture area, $A_r$, the receiver area and $A_t$ the area of the ellipsoid equatorial section, i.e. the area of the bottom cover 9 (FIG. 2) including the area of the receiver $A_r$. The etendue ratio is therefore $\Delta = A_t$, so that $$a' = a/[a + (1-a)(A_e/A_t)]$$

now depends only on $A_e/A_t$, and not on $D = A_e/A_c$, so that the cell area can be small compared to $A_e$. We see that $A_e/A_t$ plays the same role in this cavity as D in the spherical one, but that now the concentration on the cell is independent of $a'$.

It should be noted that the bottom cover does not play a role because no light reaches it. In consequence it can be removed or located in a position below, so that room is left for contacting of the cell (if this is the receiver) or for other purposes.

The cavity shown in FIG. 4, that allows the use of two solar cells of different bandgaps, is based on the principle of design (B). A curved mirror 5 is an ellipsoid of revolution around the axis 8, characterized by the position of the vertices 6 and the foci 7 of the ellipse in the outline. This ellipsoid is cut by its equatorial plane and closed there with a cover 9. The entry aperture is, in this outline, the segment between the foci 7 of the ellipse, corresponding to a circle whose diameter is the distance between the foci of the ellipse in the outline. The high bandgap cell, circular, is represented by the segment 11, located at an arbitrary centered position in the bottom of the cavity. The low bandgap cell 12 is attached to the cavity cover and has the form of a circular ring represented by two symmetric segments at the outline. The high bandgap cell 11 is illuminated by the bundle 2 which is $H_{er}$. Part of the radiation 13 reflected by this cell, the radiation carried by $H_{rne}$, is directed to the low bandgap cell 12. The other part 14 escapes. Most of the radiation 15 reflected by the low bandgap cell 12 is reflected back to itself.

FIG. 5 is a perspective of the cavity of FIG. 4. Here the cavity 5 has an ellipsoidal shape and is closed with a flat cover 9 having the circular entry aperture therein. The back of the ring shaped Si cell 12 appears on this cover.

The preceding cavities can also be filled with an optically dense dielectric medium, solid or liquid. In the first case an air gap can be left between the dielectric and the mirrored surface; in this way many of the reflections can be total internal reflections that are produced without losses. The reflecting surfaces are mirror reflectors in the ellipsoid and, preferably, white diffusive reflectors on the cover of the cavity in FIG. 4.

When the cavity is filled by a dielectric (an optically dense medium), the lines of the geometrical vector flux of $H_e$ are modified, so the designs according procedure (B) are also modified.

Figure 6:
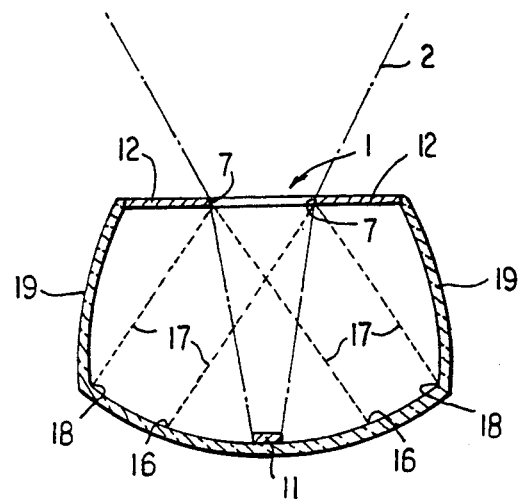
FIG. 6 represents a cross section of a dielectric filled RDC for double absorber when the entry aperture is flat, also comprehended in this invention.

FIG. 6 shows the cross section of the cavity when the shape of the dielectric interface is flat and coincides with the cavity aperture. The cavity mirror cross-section between points 16 is an ellipse with foci at 7. The rays 17 linking the points 16 with the foci form an angle equal to $\arcsin(1/n)$ with the normal to the entry aperture (n is the refractive index of the dielectric). From the points 16 to points 18, the cavity mirror cross section is a parabola with foci at 7 and axis parallel to 17. The cells 11 and 12 are located as shown in FIG. 4. The cavity is closed with a mirror 19 of arbitrary shape, such that it is outside the active region of the cavity. The cross section of this active region is the one bounded by the aperture, the mirror between the points 18 (left and right) and the straight lines parallel to 17 and linking the points 7 and 18.

Figure 7:
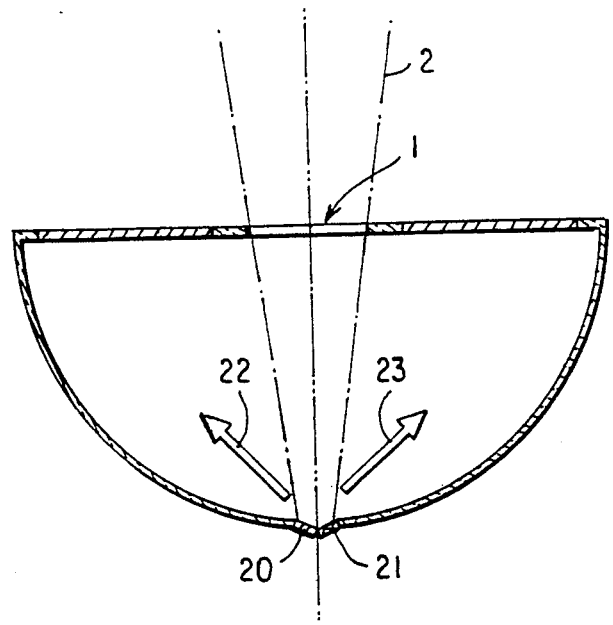
FIG. 7 represents a RDC cavity with double absorber using a subcavity inside the RDC, also comprehended in this invention.

In all these cavities, the cell located in front of the entry aperture can send to this aperture a substantial fraction of the incoming light, particularly if the reflection has a strong mirror component (in opposition of being diffusive). To avoid this the cell can be located inside a secondary cavity, or subcavity, that presents at is entry aperture a diffusive reflectivity. A simple form of this subcavity is just to tilt this cell, or to put two cells in the way shown in FIG. 7. There, the cells are half circles, 20 and 21, or better half ellipses whose projections on the horizontal plane are half circles, so that the specularly reflected light 22, and 23 is sent into the cavity, and not to the entry aperture. This is actually a subcavity, since some of the reflected light is cast on the neighboring cell.

Figure 8:
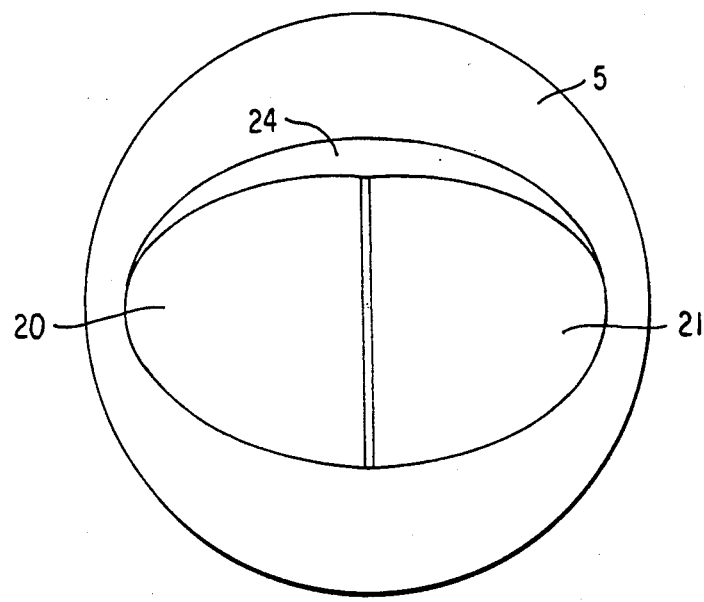
FIG. 8 represents a detail of a simple subcavity based on two tilted absorbers.

A detail of the mounting of these cells is shown in perspective in FIG. 8. The cells 20 and 21 are located in a cylindrical hole drilled in the cavity wall 5, whose wall 24 is mirrored or painted white.

Figure 9:
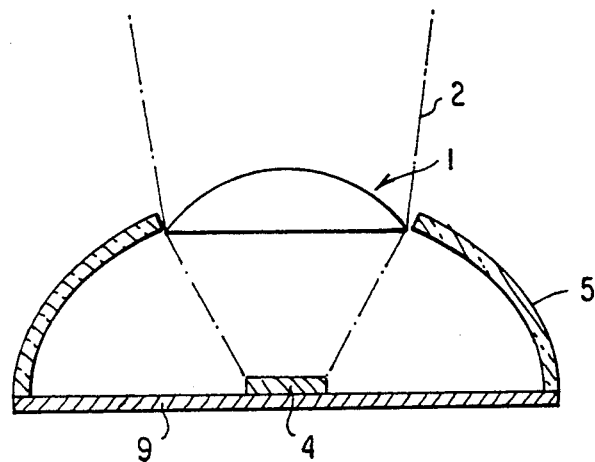
FIG. 9 represents the cross section of a radiating disc cavity filled with an optically dense medium with a lens at its aperture, also comprehended in this invention.

It can be interesting to add a lens at the cavity entry aperture. Such lens may improve the concentration or the uniformity of the irradiance distribution at the receiver. If the cavity is filled with a dielectric, it can be of interest to incorporate the lens to the cavity by making a curved entry aperture, as the one shown in FIG. 9. The cavity of FIG. 9 is identical to the one of FIG. 2, except that it uses a lens at the entry aperture and it is filled with a dielectric.

Also comprehended in this invention are general cavities based on any kind of closed concentrator. Such a device always converts an angle-limited light bundle of rays on its entry aperture into an almost isotropic bundle of rays at a receiver (in fact it is the same bundle that presents different properties at each of the two surfaces). The limit angle of the bundle at the entry aperture of the concentrator is called the acceptance angle. A cover is located at the entry aperture of such a concentrator, leaving only a fraction of it uncovered that forms the cavity entry aperture. We call angle transforming cavity (ATC) to the cavities under this concept. An example, corresponding to the classical Compound Parabolic Concentrator (CPC) [W.T. Welford, R. Winston. High Collection Nonimaging Optics. Academic Press, N.Y., 1989] is the cavity represented in FIG. 10.

In this cavity a mirror 25 is made in such a way that any ray issuing from the receiver 11 reaches the upper plane, in which is located the entry aperture 1, within a specific limited angle. The cavity is covered with another receiver (the lower bandgap cell) 12 or, if to be used with a single type of cells, with a mirror.

This cavity is illuminated with the bundle 2 formed by the rays entering the cavity within the acceptance angle of the CPC. Any ray entering the cavity within this beam will reach the receiver 11, but now, in contrast with the preceding cavities, the illumination of the receiver 11 by the bundle 2 is not direct but after some reflections (usually one) in the mirror 25. An example of this behaviour is that of the ray 26 which reaches the edge 27 of the cell.

The light reflected by the receiver 11 will end, within a limited angle on the upper cover, and the rays hitting the cavity aperture 1 will escape. Those hitting the upper cover 12 will be turned down (if this cover is a mirror) within the acceptance angle of the concentrator and will fall again on the receiver 11. An example of this behaviour is ray 28.

If the cover 12 is a receiver, or in general a diffusive reflector, some photons will be reflected within the adequate angle, and will reach the receiver 11, but some others will be turned back, after several reflections, reaching again the cover 12, as it does ray 29, or the cavity aperture 1, as it does ray 30. This latter possibility did not occur in the preceding cavities.

Note that this cavity can be seen as derivation of method A of design, in which we draw the geometrical vector flux created by the ensemble receiver concentrator. The top cover, a straight line now, is a line perpendicular to the geometrical vector flux.

Modifications within the scope of the appended claims will be apparent to those of skill in the art.

We claim:

1. Apparatus for confining light comprising cavity means forming a cavity and at least one absorber in said cavity, said cavity means having an aperture through which said light enters into the cavity and a mirror curved such that the points of the mirror that can be illuminated from the aperture are normal to the lines of geometrical vector flux created by the bundle of rays issuing from one face of the entry aperture.

2. Apparatus according to claim 1 wherein the surface of said mirror is normal to the lines of the geometrical vector flux created by the bundle of rays issuing from one face of the cavity aperture after this bundle of rays has crossed a second optical system.

3. Apparatus for confining light comprising cavity means forming a cavity and absorber means in said cavity for absorbing said light, wherein said cavity means has an aperture therein through which said light enters into said cavity and an optical system, said optical system directing light reflected by said absorber means such that light escaping from the cavity through the aperture has a limited angular spread and wherein said cavity includes an optically dense dielectric medium.

4. Apparatus for confining light comprising cavity means forming a cavity and absorber means in said cavity for absorbing said light, said cavity means forming an aperture through which the radiation enters into said cavity, wherein said cavity means comprises a curved mirror having a surface normal to the lines of geometrical vector flux created by the bundle of rays issuing from one face of said absorber means and wherein said cavity includes an optically dense dielectric medium.

* * * * *